United States Patent [19]

Gay

[11] 4,070,633
[45] Jan. 24, 1978

[54] REMOTE CONTROLLED AMPLIFIER

[75] Inventor: Michael John Gay, Geneva, Switzerland

[73] Assignee: Motorola Inc., Schaumburg, Ill.

[21] Appl. No.: 776,332

[22] Filed: Mar. 10, 1977

[51] Int. Cl.² ............................................. H03G 3/30
[52] U.S. Cl. .................................. 330/254; 330/278; 330/295
[58] Field of Search .................... 330/29, 30 R, 30 D, 330/124 R, 69; 179/1 G, 1 VL, 100.4 ST; 358/27

[56] References Cited

FOREIGN PATENT DOCUMENTS 2,404,331   7/1975   Germany .............................. 330/29

*Primary Examiner*—James B. Mullins
*Attorney, Agent, or Firm*—Joe E. Barbee

[57] ABSTRACT

An electronic circuit for amplifying a plurality of signals and providing balance between individual signals of the plurality of signals is provided. A first amplifier has at least a first and a second output and is responsive to a balance input so that balance between the outputs of the first amplifier can be achieved. A second amplifier is in parallel with the first amplifier and controls amplitude of the outputs of the first amplifier and is responsive to a volume control input. A third amplifier for amplifying one of the plurality of signals is responsive to the first output of the first amplifier while a fourth amplifier for amplifying another of the plurality of signals is responsive to the second output of the first amplifier. The third and fourth amplifiers each include a fifth amplifier, a first means for providing a current source for the fifth amplifier and receiving as an input one of the signals to be amplified, a sixth amplifier which cooperates with the fifth amplifier to amplify the signal, and second means for providing a current source for the sixth amplifier wherein the second means is controlled by a feedback loop around the sixth amplifier and wherein the second means can provide an output signal having predetermined amplitude and which is balanced with respect to other signals of the plurality of signals.

6 Claims, 2 Drawing Figures

REMOTE CONTROLLED AMPLIFIER

BACKGROUND OF THE INVENTION

This invention relates in general to circuits for amplifying signals and, more particularly, relates to circuits which are useful in audio systems having more than one audio output channel wherein the audio signal can be remotely controlled.

Variable gain circuits controlled by a continuous voltage are widely used for volume controls, as for instance, in a television receiver. The use of such circuits is desirable because the audio signal does not pass through a control potentiometer which may be located some distance from the signal processing circuits thereby avoiding radiation problems generally associated with the coupling wires from the control potentiometer to the signal processing circuit. However, certain disadvantages exist with some of the circuits used in the past such as having outputs which do not have the same return reference as the input signal thereby requiring a level shifting circuit. Another disadvantage is that some of the prior art circuits do not have the proper gain response so that the balance and volume control of an audio signal can not be combined in the same circuit. If a combination of volume and balance control of an audio system having more than one audio channel were made possible the result would be reduced circuitry in a stereo or quadraphonic system.

Accordingly, one of the objects of the present invention is to provide an improved amplifier.

Another object of the present invention is to provide an electronic amplifier circuit having a logarithmic gain response and providing an output having the same return reference as an input signal.

Yet another object of the present invention is to provide a circuit capable of simultaneously amplifying at least two signals and providing gain control for the at least two signals as well as balance control between the at least two signals.

A further object of the invention is to provide a monolithic integrated circuit capable of amplifying a plurality of signals and having the capability of being remotely controlled.

SUMMARY OF THE INVENTION

In carrying out the above and other objects of the invention in one form, there is provided an improved remote control amplifier. One illustrated embodiment of the invention includes a monolithic integrated circuit having a first amplifier responsive to a differential input. An input amplifier to receive an input signal serves as a current source for the first amplifier. A second amplifier responsive to a differential input is coupled to the first amplifier and acts upon an output from the first amplifier. A current source for the second amplifier provides an output for the circuit. The current source which is coupled to the second amplifier is controlled by a feedback loop around the second amplifier. The integrated circuit thereby provides an output with a magnitude which is controlled by a control voltage applied to the differential inputs of the first and second amplifiers.

Also provided is a circuit capable of amplifying more than one signal and having a first means for amplifying the first signal wherein the first means has a gain that is variable in response to a control signal. Also provided is a second means for amplifying a second signal and having a gain that is variable in response to the control signal. A differential amplifier provides the control signal for balancing the gain between the first and second means. Another amplifier is coupled in parallel with the differential amplifier for controlling magnitude of the control signal for the first and second means. The control signal provides gain control for the first and second means and also provides gain balance between the first and second means.

The subject matter which is regarded as the present invention is set forth in the appended claims. The invention itself, however, together with further objects and advantages thereof, may be better understood by referring to the following detailed description taken in conjunction with the accompanying drawings.

The exemplifications set out herein illustrate the preferred embodiments of the invention in one form thereof, and such exemplifications are not to be construed as limiting in any manner.

DESCRIPTION OF THE PREFERRED EMBODIMENTS

Figure 1:
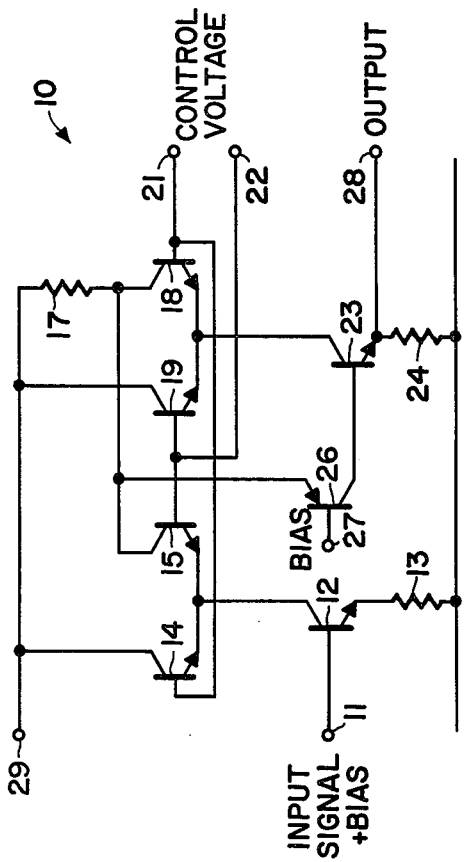
FIG. 1 illustrates in schematic form an embodiment of the invention.

FIG. 1 illustrates in schematic form a circuit 10 having a logarithmic gain response and capable of amplifying an input signal and providing an output signal having the same return reference as the input signal. The input signal is applied to input terminal 11 which is connected to the base of a transistor 12. Transistor 12 is coupled to a return reference through resistor 13. The collector of transistor 12 is connected to the emitters of transistors 14 and 15. Transistors 14 and 15 respond to a differential input to their bases which are connected to terminals 21 and 22 respectively. Transistor 12 and resistor 13 form a current source for transistors 14 and 15. The amount of current supplied by transistor 12 is controlled by the input signal at terminal 11. Not only does transistor 12 serve as a current source it also serves as an input amplifier. Its output current is divided between transistors 14 and 15 according to a control voltage applied to terminals 21 and 22. The signal current flowing through transistor 14 is wasted since the collector of transistor 14 is connected to power supply terminal 29. The collector of transistor 15, however, is coupled to supply terminal 29 through a resistor 17 and therefore any current flowing through the collector of transistor 15 produces a voltage drop across resistor 17. The quiescent current in transistor 15 varies in exactly the same way as the signal current. To eliminate this variation which would consequently occur in the quiescent output voltage it is desirable to add a second pair of transistors 18 and 19 which are fed at their emitters with the same quiescent current as transistors 14 and 15 and having their bases and collectors coupled with those of transistors 14 and 15. By this arrangement, as the quiescent current supplied by transistor 15 decreases that supplied by transistor 18 increases in an exactly complementary manner. Resistor 17 serves as a load resistor for transistors 15 and 18. In the past, the output of the circuit so far described was taken from the junction of resistor 17 and the collector of transistor 18. However it should be noted that such an arrangement suffered from two disadvantages, one being that the output signal did not have the same return reference as the input signal, and the other being that such a circuit did not have a logarithmic gain response, thereby rendering the circuit unsuitable for use as a combined balance and volume control circuit for more than one audio channel. To overcome these disadvantages a transistor 26 was provided having its collector connected to a base of a transistor 23. The emitter of transistor 26 is connected to the collectors of transistors 15 and 18 thereby forming a feedback loop including transistors 18, 23 and 26. The base of transistor 26 is connected to terminal 27 to which a bias voltage is applied. This bias voltage establishes the current flowing through resistor 17. The base of transistor 19 is connected to the base of transistor 15 and also to control voltage terminal 22 while the base of transistor 18 is connected to the base of transistor 14 and to control voltage terminal 21. The output 28 of the circuit is taken from the emitter of transistor 23 which is coupled to a return reference level by resistor 24.

The circuit of FIG. 1 provides a logarithmic gain response and also incorporates its own level shifting. Circuits having logarithmic gain response will provide, in response to a constant difference between the control voltages applied thereto, a constant difference in their gains, in decibels (dB), irrespective to the level to which the gains are set. That is the gains will track exactly. It is thus evident that two such circuits will provide volume and balance facilities in a stereo system, for example, balance being obtained by means of an offset between the control voltages applied to each circuit. An input signal plus the bias is applied to the input terminal 11 which causes a current to flow in the collector of transistor 12. This current is divided between transistors 14 and 15 in a manner controlled by the control voltage applied to terminals 21 and 22. Transistors 18 and 19 have their bases and collectors coupled with those of transistors 14 and 15. The collectors of transistors 15 and 18 are connected to a feedback loop formed by transistors 18, 23 and 26. By making the gain of this loop sufficiently high, transistor 18 will conduct a signal current almost exactly equal, but one of phase, to that supplied by transistors 15. The difference in current is only the base current required by transistor 23 to cause it to supply the necessary current for transistors 18 and 19 and this current is normally of a low enough value to be negligible. The current supplied by transistor 23 to transistors 18 and 19 also flows through resistor 24 which produces an output at output terminal 28 since terminal 28 is connected to a junction formed by resistor 24 and the emitter of transistor 23.

To establish a quiescent output voltage independent of the circuit's gain, the base of transistor 26 is connected to a bias potential at terminal 27 which defines a voltage across resistor 17 of such magnitude that the quiescent current flowing through this resistor is equal to that supplied by transistor 12 to transistors 14 and 15. Thus, the total quiescent current in transistors 15 and 18 equals that in transistor 12 and, since the total quiescent current in transistors 14 and 15 is also obviously equal to that in transistors 12 it follows that the quiescent currents in transistors 14 and 18 will be equal. Due to the interconnection of the transistor bases the ratio of the currents in transistors 18 and 19 is the same as that of the current in transistors 14 and 15. Since the currents in transistor 14 and 18 are equal it thus follows that the current in transistors 15 and 19 are equal also and, consequently, that the total current in transistors 18 and 19 which flows in transistor 23 is equal to the total current in transistors 14 and 15 and which is supplied by transistor 12. Hence, the quiescent current in transistor 23 is equal to the constant quiescent current in transistor 12 irrespective to the current division ratio at the emitters of transistors 14, 15 and 18, 19. It will be recognized that the gain of circuit 10 is a ratio of the current flowing in the collector of transistor 23 to the current flowing in the collector of transistor 12 and can be expressed as an exponential function of the control voltage applied between terminals 21 and 22, that is, the gain expressed in decibels will be proportional to the control voltage applied between terminals 21 and 22.

The foregoing shows that the circuit of FIG. 1 provides a stable quiescent output voltage, a logarithmic gain control characteristic, and an output signal which has the same ground or return reference as the input signal. Two such circuits can be used to provide balance and volume controls in a stereo system when used in conjunction with another control circuit which will be described with reference to FIG. 2.

Figure 2:
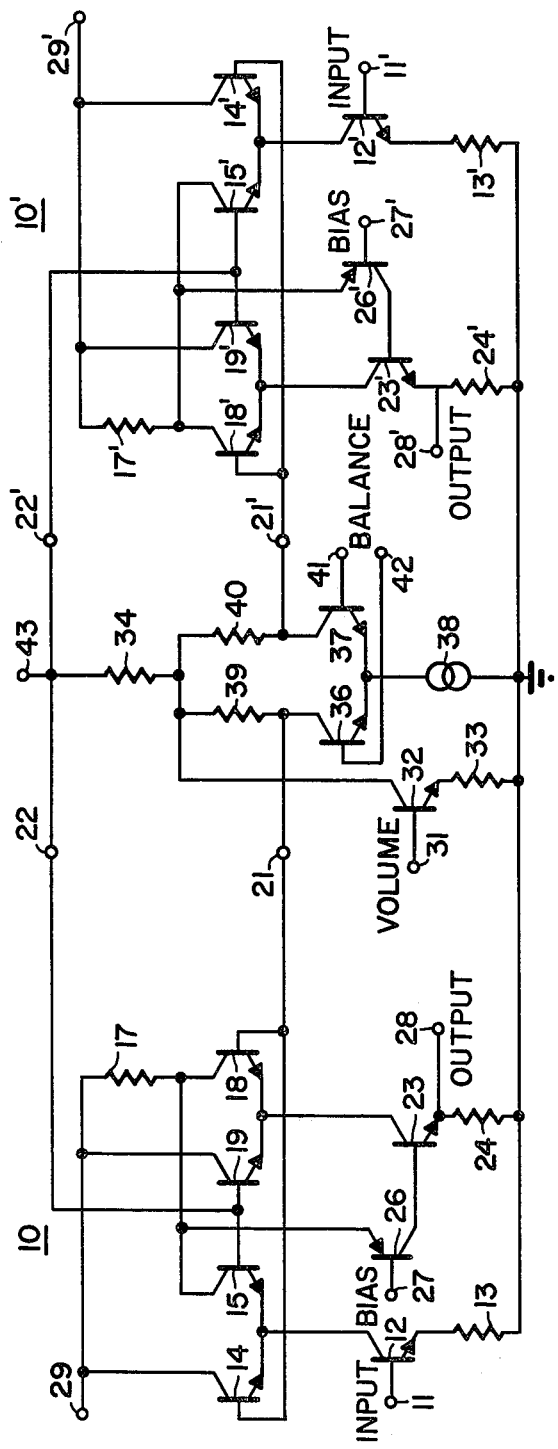
FIG. 2 illustrates in schematic form an embodiment of the invention which includes the circuitry of FIG. 1.

In FIG. 2 a control circuit is illustrated along with amplifiers 10 and 10'. Transistor 32 receives an input at input terminal 31 which for purposes of illustration is shown as a volume control input in the form of a voltage input. The emitter of transistor 32 is coupled to the zero volt reference level by resistor 33. The collector of transistor 32 is coupled to a power source 43 through a resistor 34. The collector of transistor 32 is also connected to resistors 39 and 40. Resistors 39 and 40 are in the collectors of transistors 36 and 37 respectively. The base of transistors 36 is connected to a terminal 42 while the base of transistor 37 is connected to a terminal 41. An input signal or voltage which for purposes of illustration has been indicated to be a balance input signal appearing at terminals 41 and 42 controls the distribution of current flowing through transistor 36 or 37 from a current source 38. Current source 38, which can be realized in any convenient manner, is connected to the emitters of transistors 36 and 37. Transistor 32 amplifies the signal appearing at terminal 31 and applies this amplified signal to the junction formed by resistor 34 and resistors 39, 40. Transistor 32 appears in parallel with the differential amplifier formed by transistors 36 and 37. This allows transistor 32 to control the amplitude or the magnitude of the output of the differential amplifier. The differential amplifier has an output from the collector of transistor 36 which is connected to terminal 21 and an output from the collector of transistor 37 which is connected to terminal 21'. The balance between these two outputs is controlled by the input signal at terminals 41 and 42. The operation of circuit 10 was described with reference to FIG. 1 while the operation of circuit 10' is the same as circuit 10. The elements of circuit 10' all carry the same primed numbers as the circuit in FIG. 1 to indicate the duplicity of the circuit of FIG. 1.

Transistor 32 produces a control current through resistor 34 to vary the gain of both channels 10 and 10' simultaneously. A constant current supplied by current source 38 is divided between transistors 36 and 37 according to the balance control voltage applied between terminals 41 and 42, and can produce differing voltages across the collector circuit resistors 39 and 40. These voltages are added to the gain control voltage developed across resistor 34 so that the total control voltages applied to the two gain control circuits differ by a controlled amount. This can cause a gain difference to balance or unbalance the two channels 10 and 10' which is independent of the volume control setting. Although this circuit has been described in relationship to audio signals it will be appreciated that it could be used to amplify any signals in which two external voltages are used to act upon the signals. The circuit is responsive to DC voltages and therefore does not require the signal applied to terminals 11 and 11' to pass through a potentiometer. If a potentiometer is used to control the voltages applied to terminal 31 or terminals 41 and 42, it can be located remotely from the circuit of FIG. 2.

It will be recognized by those persons skilled in the art that the gain of the feedback loop formed by transistors 18, 23 and 26 can be increased to thereby increase the accuracy and range to the logarithmic control characteristic of the circuit of FIG. 1 by replacing transistor 23 with a Darlington combination circuit. Also resistor 17 may be replaced by a current source equal to the quiescent current flowing in transistor 12. Another change that can be easily made is to replace the amplifier formed by transitors 23 and 26 by any other convenient amplifier. The invention, while described with reference to a stereo audio system, can be used with other multi-channel audio systems or in any application requiring balance control between signals as well as gain control of the signals.

Consequently, while in accordance with the Patent Statutes, there has been described what at present are considered to be the preferred forms of this invention it will be obvious to those skilled in the art that numerous changes and modifications may be made herein without departing from the spirit and scope of the invention, and it is therefore aimed in the following claims to cover all such modifications.

What is claimed is:

1. A circuit capable of amplifying more than one signal, comprising: first means for amplifying a first signal and having a gain that is variable in response to a control signal; second means for amplifying a second signal and having a gain that is variable in response to the control signal; a differential amplifier to provide the control signal for balancing the gain between the first and second means; and an amplifier coupled in parallel with the differential amplifier for controlling magnitude of the control signal for the first and second means, so that the control signal can provide gain control for the first and second means and gain balance between the first and second means.

2. The circuit of claim 1 wherein the first and second means each have a first and a second differential amplifier, bases on the first and second differential amplifiers are interconnected so that the control signal controls amount of amplification of the first and second differential amplifiers, and each first and second means having negative feedback means.

3. A monolithic integrated circuit, comprising: a first amplifier responsive to a differential input for amplifying a signal; an input amplifier to receive an input signal and serve as a current source of the first amplifier; a second amplifier responsive to a differential input and coupled to the first amplifier to act upon an output from the first amplifier; and a current source for the second amplifier, the current source having an output terminal and a control terminal which is coupled to the second amplifier and controlled by a feedback loop around the second amplifier; and an integrated circuit output terminal coupled to the output terminal of the current source to obtain an output for the integrated circuit directly from the current source, thereby providing a circuit having an output with a magnitude which is controlled by a control voltage applied to the differential inputs of the first and second amplifiers.

4. A circuit capable of amplifying two signals simultaneously and having a first channel and a second channel wherein the first channel includes a first amplifier for receiving and amplifying a first input signal, a second amplifier having the first amplifier as a current source and having an output, a third amplifier coupled to the second amplifier for amplifying the output of the second amplifier, and means for providing a current source for the third amplifier and adapted to be controlled by the feedback loop around the third amplifier, the means for providing also producing an output for the first channel; and the second channel includes a fourth amplifier for receiving and amplifying a second input signal, a fifth amplifier having the fourth amplifier as a current source and having an output, a sixth amplifier coupled to the fifth amplifier for amplifying the output of the fifth amplifier, second means for providing a current source for the sixth amplifier and adapted to be controlled by a feedback loop around the sixth amplifier, the second means providing an output for the second channel; a differential amplifier having a first and a second output and an input; and a seventh amplifier coupled to the differential amplifier to control amplitude of the first and second outputs thereby providing signal amplitude control for the circuit and wherein the first and second outputs are for controlling the gains of the second, together with the third amplifier, and of the fifth amplifier, together with the sixth amplifier, thereby providing a balance control between the first and second channels.

5. An electronic circuit for amplifying a plurality of audio signals and providing balance between individual signals of the plurality of audio signals, comprising: a first amplifier having at least a first and a second output, the first amplifier being responsive to a balance input for providing balance between the outputs of the first amplifier; a second amplifier in parallel with the first amplifier for controlling amplitude of the outputs of the first amplifier and being responsive to a volume control input; a third amplifier for amplifying one of the plurality of audio signals and being responsive to the first output of the first amplifier; and a fourth amplifier for amplifying another of the plurality of audio signals and being responsive to the second input of the first amplifier.

6. The circuit of claim 5 wherein the third and fourth amplifiers each further include a fifth amplifier; a first means for providing a current source for the fifth amplifier and being controlled by an audio signal which is to be amplified; a sixth amplifier cooperates with the fifth amplifier to amplify the audio signal; and second means for providing a current source for the sixth amplifier, the second means being controlled by a feedback loop around the sixth amplifier, and wherein the second means can provide an output signal.

* * * * *